(12) United States Patent
Ikeda et al.

(10) Patent No.: US 8,915,775 B2
(45) Date of Patent: Dec. 23, 2014

(54) EXHAUST SYSTEM

(75) Inventors: Takeshi Ikeda, Arida (JP); Kazuo Koizumi, Kobe (JP); Hiroyuki Takeda, Fuchu (JP); Tetsuo Koyama, Fukushima-ken (JP); Keiichi Watanabe, Fukushimaken (JP)

(73) Assignees: Mitsubishi Cable Industries, Ltd., Tokyo (JP); Spansion LLC, Sunnyvale, CA (US)

( * ) Notice: Subject to any disclaimer, the term of this patent is extended or adjusted under 35 U.S.C. 154(b) by 1605 days.

(21) Appl. No.: 11/790,305

(22) Filed: Apr. 24, 2007

(65) Prior Publication Data

US 2008/0072585 A1    Mar. 27, 2008

(30) Foreign Application Priority Data

Apr. 24, 2006 (JP) .................................. 2006-118728
Apr. 24, 2006 (JP) .................................. 2006-118729
Apr. 19, 2007 (JP) .................................. 2007-110264

(51) Int. Cl.
*F24F 13/00*    (2006.01)
*C23C 16/44*    (2006.01)

(52) U.S. Cl.
CPC .................................. *C23C 16/4412* (2013.01)
USPC ......................................................... 454/49

(58) Field of Classification Search
USPC ........... 60/324, 286; 454/53, 49; 49/193, 382; 105/377.01
See application file for complete search history.

(56) References Cited

U.S. PATENT DOCUMENTS

| 5,320,124 A | * | 6/1994 | Palmer .......................... 137/501 |
| 5,510,017 A | | 4/1996 | Abdullayev |
| 5,578,132 A | | 11/1996 | Yamaga et al. |
| 5,819,683 A | | 10/1998 | Ikeda et al. |
| 5,833,888 A | * | 11/1998 | Arya et al. ................. 261/112.1 |
| 5,935,283 A | * | 8/1999 | Sweeney et al. ................. 55/431 |
| 5,957,678 A | * | 9/1999 | Endoh et al. ...................... 431/5 |

(Continued)

FOREIGN PATENT DOCUMENTS

| JP | 4136175 A | * | 5/1992 |
| JP | H7-256002 A | | 10/1995 |

(Continued)

OTHER PUBLICATIONS

Extended European Search Report dated Jan. 7, 2010; Application No. 07776247.4-2122 / 2013378 PCT/US2007010112.

(Continued)

*Primary Examiner* — Steven B McAllister
*Assistant Examiner* — Brittany Towns
(74) *Attorney, Agent, or Firm* — Studebaker & Brackett PC

(57) ABSTRACT

An exhaust system includes: an exhaust pressure controller interposed in an exhaust passage and including: a pipe body including a side peripheral wall in which at least one port is formed; and a gas introduction wall for introducing an exhaust gas flowing from an upstream side of the pipe body so that the exhaust gas flows downstream without coming into direct contact with the port and vicinity thereof, one face of the gas introduction wall forming a pressure control path together with an inner face of the side peripheral wall while another face of the gas introduction wall forming an exhaust gas path along which the exhaust gas flows. The port communicates with the pressure control path, and the pressure control path communicates with the exhaust gas path at part downstream of the port.

20 Claims, 16 Drawing Sheets

(56) References Cited

U.S. PATENT DOCUMENTS

| | | | |
|---|---|---|---|
| 6,085,830 A | 7/2000 | Mashiko et al. | |
| 6,223,684 B1 | 5/2001 | Fujioka et al. | |
| 6,432,372 B2 * | 8/2002 | Schumacher | 423/210 |
| 6,966,936 B2 * | 11/2005 | Yamasaki et al. | 55/385.2 |
| 7,537,628 B2 * | 5/2009 | Tsuji | 55/442 |
| 7,670,399 B2 * | 3/2010 | Park | 55/385.2 |
| 2002/0056311 A1 * | 5/2002 | Nomura et al. | 73/46 |

FOREIGN PATENT DOCUMENTS

| | | | |
|---|---|---|---|
| JP | 09 225230 A | | 9/1997 |
| JP | H11-51576 A | | 2/1999 |
| JP | H11-80964 A | | 3/1999 |
| JP | 2001126988 A | * | 5/2001 |
| JP | 2003-68657 A | | 3/2003 |
| KR | 10-0284236 B1 | | 12/2000 |
| KR | 10-0326623 B1 | | 2/2002 |
| WO | 98/30731 A1 | | 7/1998 |
| WO | WO 2005107922 A1 | * | 11/2005 |

OTHER PUBLICATIONS

International Search Report Application No. PCT/US07/10112 dated Nov. 29, 2007.

Korean Office Action dated Feb. 19, 2011; Application No. 10-2008-7025497.

* cited by examiner

FIG. 14
FIG. 15
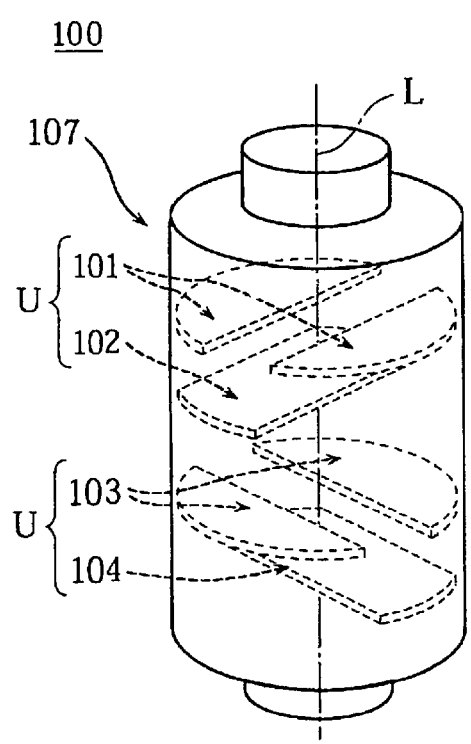
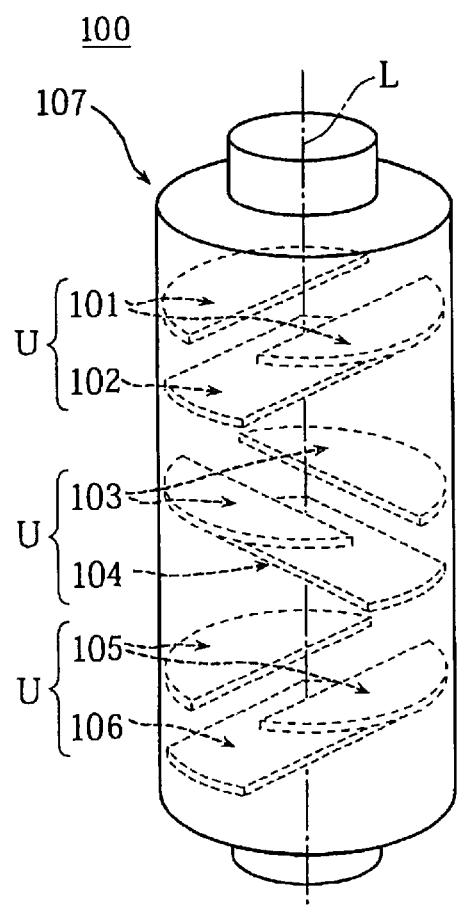

EXHAUST SYSTEM

TECHNICAL FIELD

The present invention relates to exhaust systems for discharging an exhaust gas from a reaction chamber or the like of semiconductor wafer processing equipment, and more particularly relates to an improvement on an exhaust trap that collects a solid material generated from an unreacted gas included in the exhaust gas.

BACKGROUND ART

In general, for manufacturing a semiconductor element, predetermined processing is performed while a reactive gas is introduced into a reaction chamber in processing equipment, for example, a film formation system by CVD (chemical vapor deposition), an oxidation/diffusion system for processing the surface of a semiconductor wafer, a dry etching system for forming a wiring pattern in a thin film, or the like. For example, in forming a film of poly-Si, $SiO_2$, $Si_3N_4$, or the like, a reactive gas, such as $SiH_4$, $Si_2H_6$, $SiH_2$, $Cl_2$, $NH_3$, $PH_3$, $N_2O$, TEOS, or the like is introduced into the reaction chamber to form a corresponding film on a semiconductor substrate by thermal treatment.

The reactive gases used in the processing by these systems have low utilization efficiency of several percentages, and almost all the reactive gases are discharged as unreacted gases. When an exhaust gas including such an unreacted gas passes through an exhaust passage, the unreacted gas coagulates due to temperature lowering of the exhaust gas to precipitate a solid material (for example, $NH_4Cl$ and $AlCl_3$) made of a reaction product, a liquefied material from a film formation gas, and the like on the inner walls of the pipes and the like. When the pressure in the reaction chamber is changed, for example, from a reduced pressure atmosphere to an air pressure atmosphere, the solid material precipitated in the exhaust passage flies back (backflow) into the reaction chamber to adhere to a semiconductor wafer, thereby leading to lowering of yield of the semiconductor element.

In view of the foregoing, in such an exhaust system, an exhaust pressure controller for reducing overpressure by evacuation is provided between the reaction chamber and a vacuum pump. With the exhaust pressure controller, a residual film formation component is diluted by introducing an inert gas, and overpressure is reduced by evacuation. In an exhaust pressure controller of some types, a plurality (for example, three to five) piping joints are connected to an exhaust pipe thereof for diluting the residual film formation component by introducing the inert gas and the like in addition to pressure adjustment by gas introduction/discharge. The piping joints are connected to an inert gas supply apparatus composed of an introduction pipe, a flow controller, a regulator, a chemical cylinder, and the like, a vacuum pump, and the like (see Patent Document 1, for example). Patent Document 1: Japanese Patent Application Laid Open Publication No. 5-17287

SUMMARY OF THE INVENTION

Problems that the Invention is to Solve

The exhaust pipe of the aforementioned exhaust pressure controller is heated entirely by a tape heater or the like during the operation of the processing equipment so as not to allow the residual film formation component included in the exhaust gas and the solid material generated therefrom to adhere to the inner wall thereof. As shown in FIG. 18, the exhaust pipe (short pipe) 43 has attachments, namely, piping joint 44, around which the tape heater or the like is difficult to wind. Therefore, it is difficult to heat ports 45 of the exhaust pipe 43 communicating with the piping joints 44 and the vicinity thereof sufficiently. This causes the unreacted gas included in the exhaust gas passing in the exhaust pipe 43 to come into contact with the ports 45, causing temperature lowering of the exhaust gas. The temperature lowering causes coagulation of the unreacted gas so that the coagulated unreacted gas is precipitated and adheres thereto as the solid material (deposition) D. When the deposited solid material glows, the ports 45 are clogged, thereby inhibiting introduction of the inert gas and air discharge for reducing the overpressure. As a result, the cycle of cleaning operation (maintenance) is shortened to lower the availability of the semiconductor element processing equipment.

In view of the foregoing, the present invention has its object of increasing, in an exhaust system for reducing pressure variation of an exhaust gas which includes an exhaust pressure controller including a pipe body through which exhaust gas passes and which has the side peripheral wall in which at least one port is formed, an availability of semiconductor element processing equipment or the like by preventing clogging of a residual film formation component included in the exhaust gas and a solid material generated therefrom at the port to extend a maintenance cycle of the exhaust pressure controller.

Means for Solving the Problems

To achieve the above object, the present invention provides an exhaust system including: an exhaust pressure controller interposed in an exhaust passage and including: a pipe body including a side peripheral wall in which at least one port is formed; and a gas introduction wall for introducing an exhaust gas flowing from an upstream side of the pipe body so that the exhaust gas flows downstream without coming into direct contact with the port and vicinity thereof, one face of the gas introduction wall forming a pressure control path together with an inner face of the side peripheral wall while another face of the gas introduction wall forming an exhaust gas path along which the exhaust gas flows, wherein the port communicates with the pressure control path, and the pressure control path communicates with the exhaust gas path at part downstream of the port.

In the above exhaust system, the exhaust pressure controller may further include: a ring detachably fitted to an upstream inner edge of the pipe body; and an annular sealing member fitted around an outer periphery of the ring so as to be interposed between an upstream end of the pipe body and an exhaust pipe located upstream of the pipe body, wherein an upstream end of the gas introduction wall is fixed to the ring.

Further, the gas introduction wall may be in a cylindrical form along the inner face of the side peripheral wall.

Optionally, in the case where the above exhaust system further includes an exhaust trap for causing an reacted gas in the exhaust gas to coagulate and catching it, it is preferable that the exhaust trap includes: a coagulation pipe interposed in the exhaust passage; a pair of first adhesion plates opposed to each other in the coagulation pipe with a vertical section including an axial center of the coagulation pipe interposed, a first path being formed between the pair of first adhesion plates; a band-shaped second adhesion plate formed downstream of the first path in the coagulation pipe so as to correspond to the first path as viewed in a direction of the axial center thereof and so as to bridge an inner face of the coagulation pipe, a pair of second paths being formed between the second adhesion plate and the inner face of the coagulation pipe so as to be opposed to each other with the vertical section interposed; and a plurality of fins standing on upper faces of the pair of first adhesion plates and an upper face of the second adhesion plate.

In the above case, adjacent fins standing on the upper faces of the first adhesion plates may be different in height from each other; a cylindrical cooling space to which a cooling medium is introduced may be formed inside a side peripheral wall of the coagulation pipe; each of the plurality of fins may have a surface subjected to blasting; the coagulation pipe may be detachable at an upstream end and an downstream end thereof from an upstream exhaust pipe and a downstream exhaust pipe, respectively; or the exhaust trap may further include: a pair of third adhesion plates which are substantially same in form and dimension as the pair of first adhesion plates and which are arranged downstream of the second adhesion plate in the coagulation pipe so as to be overlapped with the second adhesion plate as viewed in the direction of the axial center; and a fourth adhesion plate which is substantially same in form and dimension as the second adhesion plate and which is arranged downstream of the third adhesion plates in the coagulation pipe so as to cross over the second adhesion plate as viewed in the direction of the axial center. Further, it is preferable to arrange the exhaust trap downstream of the exhaust pressure controller. In the case where the exhaust system further includes a vacuum exhauster, the vacuum exhauster is preferably arranged downstream of the exhaust trap.

Furthermore, the exhaust system may further includes a center ring arranged at a joint part between exhaust pipes adjacent in a direction that the exhaust gas passes, wherein the center ring includes: a ring interposed between the adjacent exhaust pipes; an annular sealing member fitted around an outer periphery of the ring; a sleeve integrally formed with the ring and arranged inside at least one of the adjacent exhaust pipes; a pair of first adhesion plates opposed to each other in the sleeve with a vertical section including an axial center of the sleeve interposed, a first path being formed between the pair of first adhesion plates; a second adhesion plate formed downstream of the pair of first adhesion plates in the sleeve so as to correspond to the first path as viewed in a direction of the axial center and so as to bridge an inner face of the sleeve, a pair of second paths being formed between the second adhesion plate and the inner face of the sleeve so as to be opposed to each other with the vertical section interposed; and a plurality of fins standing on the upper faces of the pair of first adhesion plates and an upper face of the second adhesion plate.

Moreover, in the case where the above exhaust system further includes an exhaust gas detoxifier for eliminating an unreacted gas in the exhaust gas, the exhaust gas detoxifier may be arranged downstream of the center ring.

Effects of the Invention

The present invention attains the following effects.

The exhaust pressure controller of the exhaust system in accordance with the present invention prevents a solid material generated from an unreacted gas in an exhaust gas from adhering to the port and the vicinity thereof, thereby preventing the port from being clogged by adhesion and deposition of the solid material. This extends the cycle of maintenance to be performed for removing such a solid material. In the case where the exhaust system is connected to the discharge side of a reaction chamber for film formation, oxidation/diffusion, dry etching, or the like in manufacturing a semiconductor element, the extended maintenance cycle contributes to an increase in availability of the semiconductor element processing equipment.

BRIEF DESCRIPTION OF THE DRAWINGS

FIG. 14 is a schematic perspective view for explaining Modified Example 2 of the exhaust trap.

FIG. 15 is a schematic perspective view for explaining Modified Example 3 of the exhaust trap.

EXPLANATION OF REFERENCE NUMERALS

Figure 1:
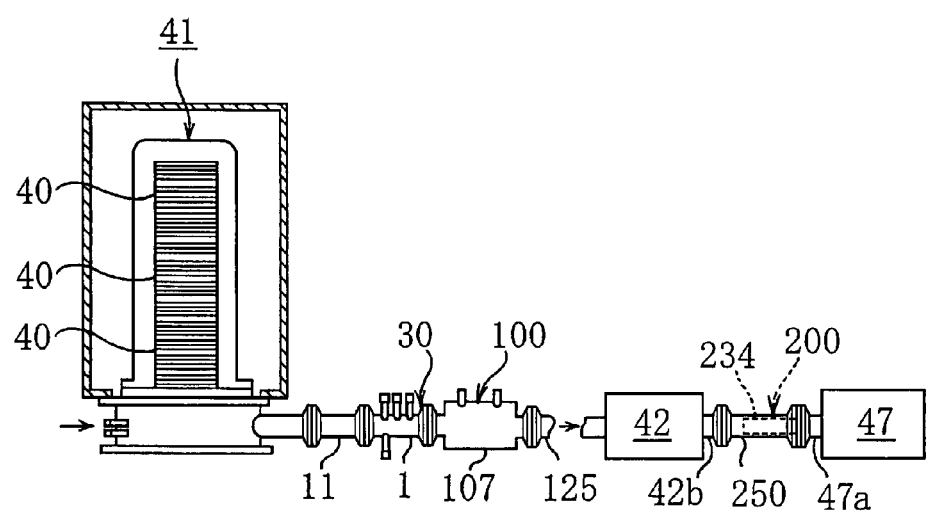
FIG. 1 is a constitutional diagram showing the entirety of an exhaust system in accordance with an embodiment of the present invention.

1 short pipe body (pipe body)
2 gas introducing wall
3 port
4 exhaust gas path
5 outer peripheral wall (side peripheral wall)
6 inner face
7 pressure control path
8 elastic sealing member (sealing member)
9 ring
11 exhaust pipe
12 downstream end
13 upstream end
21 one face
22 other face
30 exhaust pressure controller
100 exhaust trap
101 first adhesion plate
102 second adhesion plate
103 third adhesion plate
104 fourth adhesion plate
107 coagulation pipe
108 fin (on first adhesion plate)
109 fin (on second adhesion plate)
111 first path 112 second path
119 inner face
120 upper face
121 upper face
122 outer peripheral wall (side peripheral wall)
123 cylindrical cooling space
125 exhaust pipe
126 upstream end
127 downstream end
L axial center
Z vertical section
200 center ring
201 first adhesion plate
202 second adhesion plate
208 fin
209 fin
210 exhaust gas path
211 first path
212 second path
220 upper face
221 upper face
231 ring
233 O ring (sealing member)
234 sleeve
L' axial center
Z' vertical section

BEST MODE FOR CARRYING OUT THE INVENTION

Embodiments of the present invention will be described below with reference to the accompanying drawings.

FIG. 1 is a side view schematically showing the whole construction of an exhaust system in accordance with the present embodiment. The exhaust system is connected to a reaction chamber 41 of processing equipment (for example, a low pressure CVD system (LP-CVD) of vertical hot wall type) for semiconductor wafers 40. In the present embodiment, a vacuum exhauster 42 and an exhaust gas detoxifier 47 for detoxifying the exhaust gas are provided in an exhaust passage that introduces the exhaust gas from the reaction chamber 41 to the outside. An exhaust pressure controller 30 for reducing pressure variation of the exhaust gas and the like is arranged between the reaction chamber 41 and the vacuum exhauster 42. An exhaust trap 100 for causing an unreacted gas included in the exhaust gas to coagulate and recovering it is arranged between the exhaust pressure controller 30 and the vacuum exhauster 42. A center ring 200 having a trapping mechanism is interposed at a joint part between an exhaust pipe 250 connected to a downstream joint 42b of the vacuum exhauster 42 and an upstream joint 47a of the exhaust gas detoxifier 47. The vacuum exhauster 42 is composed of a combination of, for example, a mechanical booster pump and an oil-sealed rotary pump (or a water ring pump).

Figure 2:
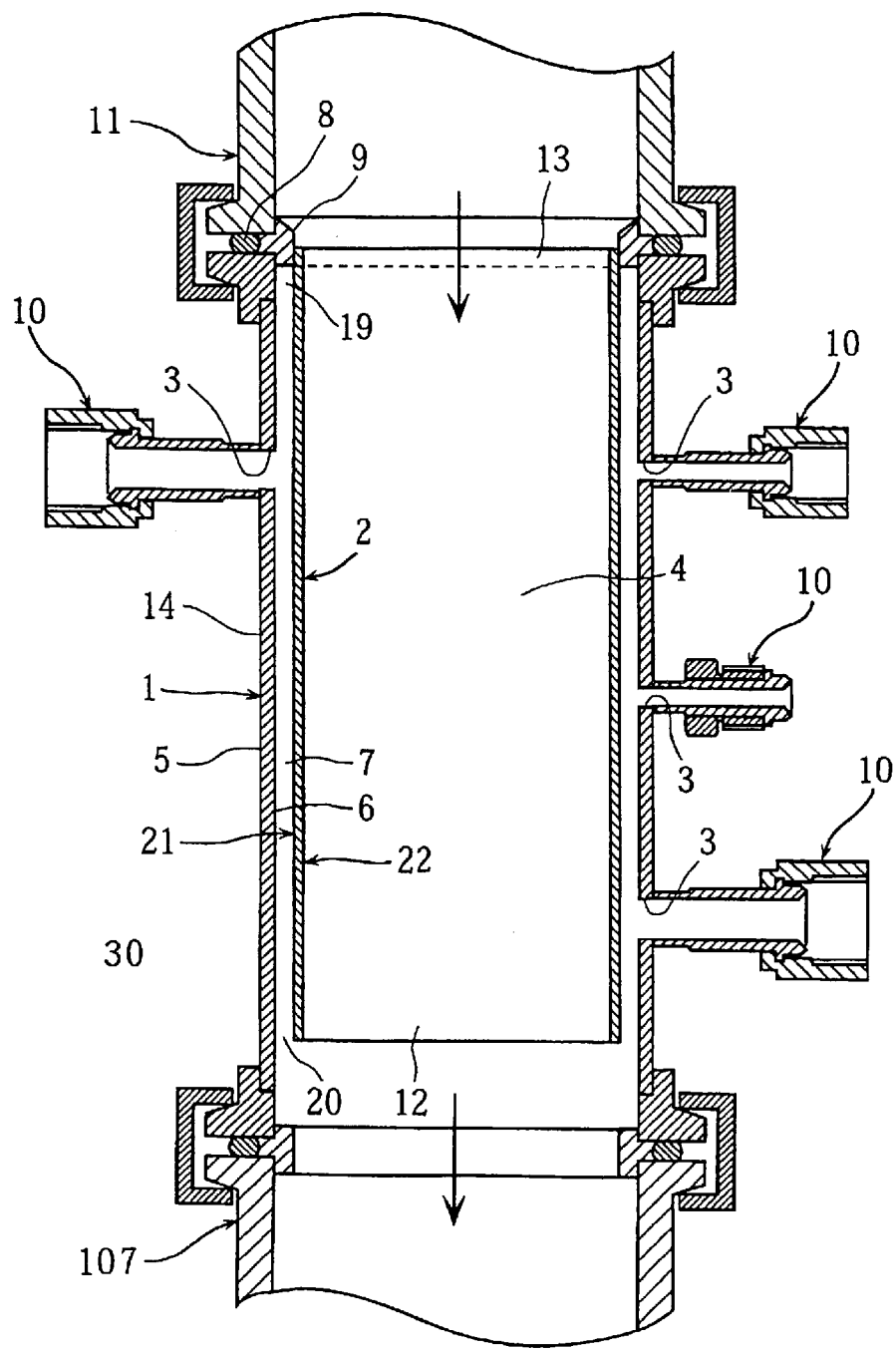
FIG. 2 is a vertical sectional view showing a construction of an exhaust pressure controller included in the exhaust system.
Figure 3:
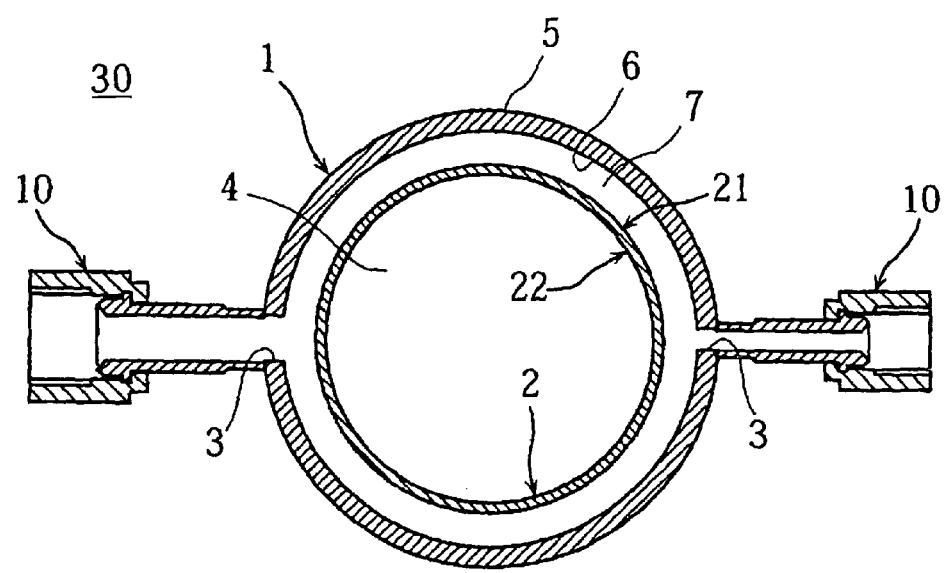
FIG. 3 is a transverse sectional view of the exhaust pressure controller.
Figure 4:
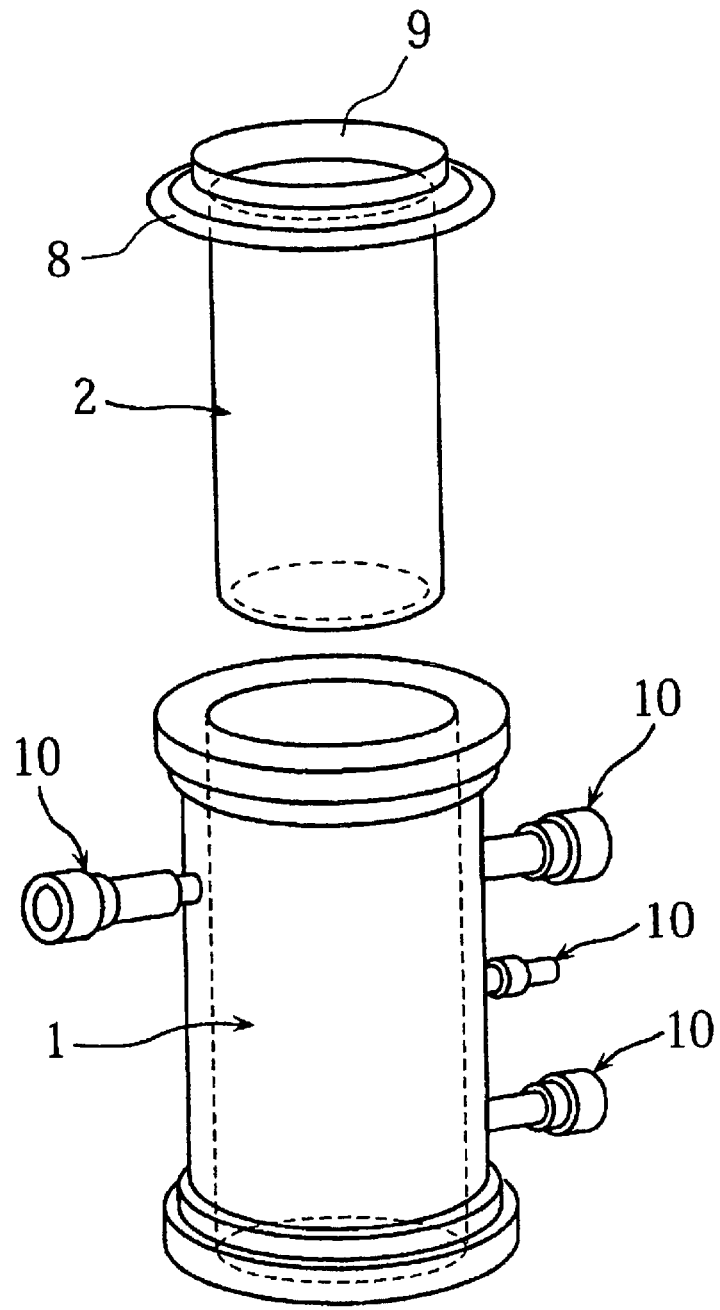
FIG. 4 is an exploded perspective view of the exhaust pressure controller.

FIG. 2 to FIG. 4 shows a whole construction of the exhaust pressure controller 30, wherein FIG. 2 is a vertical sectional view, FIG. 3 is a transverse sectional view, and FIG. 4 is a exploded perspective view.

Referring to FIG. 2, the exhaust pressure controller 30 includes a cylindrical short pipe body 1 detachably interposed in the middle of the exhaust passage. Specifically, the short pipe body 1 is arranged between a short exhaust pipe 11 connected to the reaction chamber 41 and a coagulation pipe 107 of the exhaust trap 100, which will be described later. The short pipe body 1 includes an outer peripheral wall 5 in which a plurality (four in the drawings, for example) of ports 3 are formed for air supply/discharge and/or inert gas introduction.

The short pipe body 1 further includes a gas introduction wall 2 for introducing the exhaust gas flowing from the upstream side so as to allow the exhaust gas to flow downstream without coming into contact with the ports 3 and the vicinity thereof. Specifically, a pressure controlling path 7 is formed between one face 21 of the gas introduction wall 2 and an inner face 6 of the outer peripheral wall 5 so that the other face 22 of the gas introduction wall 2 forms an exhaust gas path 4 through which the exhaust gas flows. As shown in FIG. 3, the gas introduction wall 2 is a cylindrical member that divides the short pipe body 1 into the (outer) pressure control path 7 and the (inner) exhaust gas path 4. Further, the ports 3 are formed so as to communicate with the pressure control path 7. The pressure control path 7 communicates with the exhaust gas path 4 at part downstream of all of the port 3. On the other hand, the space between an upstream end 13 of the gas introduction wall 2 and the inner wall 6 of the outer peripheral wall 5 is sealed air-tightly.

In detail, the space between a downstream end 12 of the gas introduction wall 2 is opened to the inner face 6 of the outer peripheral wall 5. The exhaust pressure controller 30 includes a metal ring 9 detachably fitted to the upstream inner edge of the short pipe body 1 and an annular elastic sealing member 8 fitted around the outer peripheral face of the ring 9. The elastic sealing member 8 is interposed between the upstream end of the short pipe body 1 and the exhaust pipe 11 on the upstream side. The upstream end 13 of the gas introduction wall 2 is fixed to the inner peripheral face of the ring 9. Namely, the ring 9 blocks the space between the upstream end 13 of the gas introduction wall 2 and the inner face 6 of the outer peripheral wall 5. Thus, the pressure control path 7 includes an upstream closed part 19 blocked by the ring 9 and a downstream open end 20 formed annually between the downstream end 12 of the gas introduction wall 2 and the inner wall 6 of the outer peripheral wall 5.

Further, the downstream open end 20 has an open area rather larger than the open area of the ports 3. This prevents clogging even if a solid material generated from an unreacted gas in the exhaust gas adheres to the gas introduction wall 2 and the like.

The gas introduction wall 2 is detachably fitted to the short pipe body 1 together with the ring 9 (and the elastic sealing member 8) (see FIG. 4). The inner peripheral face of the gas introduction wall 2 is subjected to buffing so as not to allow the solid material precipitated from the unreacted gas in the exhaust gas to adhere thereto. It is preferable that the outer peripheral face of the gas introduction wall 2 is also subjected to buffing at the same time.

A plurality of joint members 10 for connecting ends of pipes, of which other ends are connected to an inert gas cylinder, a suction pump, or the like, to the ports 3 are attached to an outer face 14 of the outer peripheral wall 5. Further, a heating member, such as a tape heater (not shown) is provided at (wounded around) the outer face 14 of the outer peripheral wall 5.

An operation of the above described exhaust pressure controller 30 will be described next. As shown in FIG. 1, the short pipe body 1 is interposed in the middle of the exhaust passage of the processing equipment for the semiconductor wafers 40, and the ports 3 of the short pipe body 1 are connected by means of the joint members 10 to the ends of the pipes of which other ends are connected to the inner gas cylinder, the suction pump, or the like. When the processing equipment for the semiconductor wafers 40 is driven, the exhaust gas discharged form the reaction chamber 41 is sent into the short pipe body 1 through the exhaust pipe 11.

In FIG. 2, the exhaust gas flowing from the upstream side into the short pipe body 1 flows inside the gas introduction wall 2 (through the exhaust gas path 4) and flows downstream without coming into direct contact with the ports 3 and the vicinity thereof. Specifically, the space between the gas introduction wall 2 and the inner face 6 is blocked by the ring 9 at the upstream end 13 of the gas introduction wall 2, so that the gas flowing from the upstream side is prevented form entering into the pressure control path 7.

For diluting the exhaust gas in the exhaust pressure controller 30, in FIG. 2, the upstream end of, for example, the upper left joint member 10 is connected to the inert gas cylinder and the on-off valve of the port 3 is opened to introduce the inert gas to the pressure control path 7 through the upper left port 3. This causes the inert gas to be filled in the pressure control path 7, to flow downstream along the gas introduction wall 2, and then to flow out from the downstream open end 20 of the pressure control path 7, so that the inert gas is combined with the exhaust gas flowing from the upstream side to dilute the exhaust gas, and then, the diluted exhaust gas flows downstream.

For increasing the pressure of the exhaust gas, the inert gas is supplied through the downstream open end 20, similarly to the case for dilution. In contrast, for reducing the pressure of the exhaust gas, part of the exhaust gas is discharged outside from the downstream open end 20 through the pressure control path 7 and a corresponding port 3.

When maintenance is necessitated because the solid material precipitated from the unreacted gas in the exhaust gas adheres to the inner wall of the gas introduction wall 2 and the like, the short pipe body 1 is first taken out from the upstream exhaust pipe 11 and the downstream coagulation pipe 107. Subsequently, the gas introduction wall 2 and the ring 9 (and the elastic sealing member 8) are pulled out from the short pipe body 1, as shown in FIG. 4. Then, they are subjected to ultrasonic cleaning.

Figure 5:
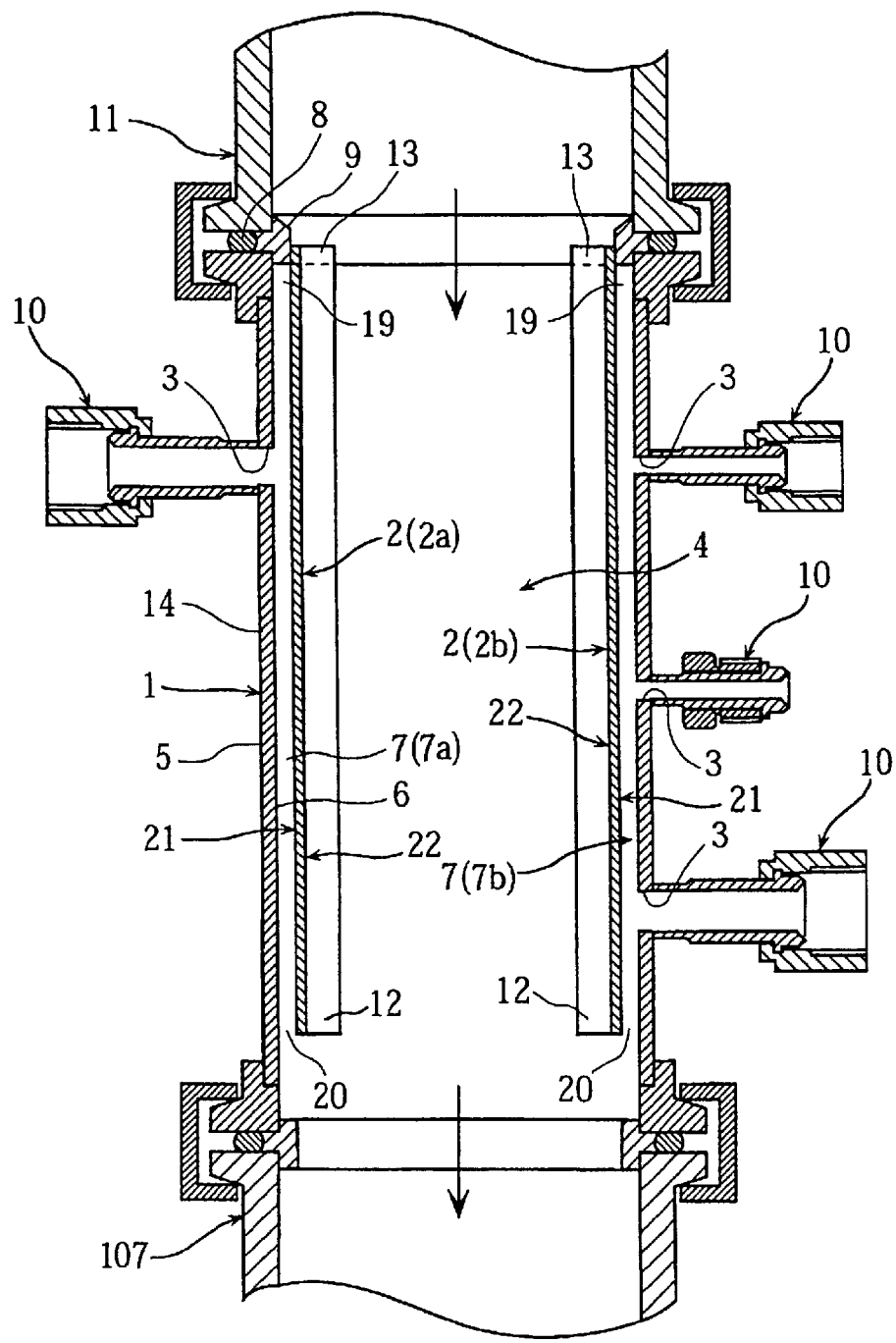
FIG. 5 is a vertical sectional view showing a modified example of the exhaust pressure controller.
Figure 6:
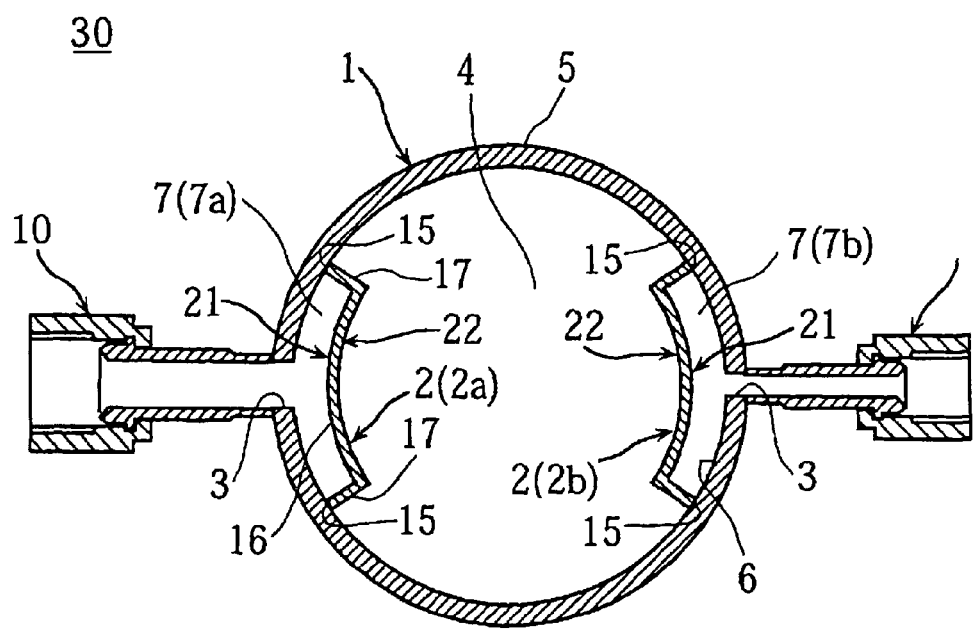
FIG. 6 is a transverse sectional view of the modified example.

FIG. 5 and FIG. 6 shows a modified example of the exhaust pressure controller 30, wherein FIG. 5 is a vertical sectional view and FIG. 6 is a transverse sectional view.

Referring to FIG. 5, two gas introduction walls 2 are arranged right and left for introducing the exhaust gas flowing from the upstream side so that the exhaust gas flows downstream without coming into contact with the ports 3 and the vicinity thereof.

In the present embodiment, the gas introduction walls 2 are a gas introduction wall 2a arranged so as to correspond (be opposed) to the upper left port 3 and a gas introduction wall 2b arranged so as to correspond (be opposed) to the other right three ports 3, as shown in FIG. 5. Accordingly, pressure control path 7a, 7b are formed between the respective one faces 21 of the gas introduction walls 2a, 2b and the inner face 6 of the outer peripheral wall 5. The upper left port 3 communicates with the left pressure control path 7a while the other right ports 3 communicate with the right pressure control path 7b. The other faces 22, 22 of the gas introduction walls 2a, 2b form the exhaust gas path 4. Further, the left pressure control path 7a communicates with the exhaust gas path 4 at part downstream of the left port 3 while the right pressure control path 7b communicates with the exhaust gas path 4 at part downstream of the lowermost right port 3.

The ring 9 having the outer peripheral face around which the annular elastic sealing member 8 is fitted is detachably fitted to the upstream inner edge of the short pipe body 1. The upstream ends 13, 13 of the gas introduction walls 2a, 2b are fixed to the inner peripheral face of the ring 9. Thus, each of the pressure control path 7a, 7b includes the upstream closed end 19 blocked by the ring 9 and the downstream open end 20 formed between the corresponding downstream end 12, 12 of the corresponding gas introduction wall 2a, 2b and the inner face of the outer peripheral wall 5

Further, as shown in FIG. 6, each gas introduction wall 2a, 2b is bent at respective end portions in the peripheral direction thereof, and each tip end face of the end portions serves as a contact end face 15, 15 in contact with the inner face 6 of the outer peripheral wall 5 in the closed state. In detail, each gas introduction wall 2a, 2b includes an arc portion 16 extending in the axial direction of the short pipe body 1 along the inner face 6 of the outer peripheral wall 5 and straight short portions 17, 17 extending radially outwardly from the respective ends of the arc portion 16. In other words, the pressure control paths 7a, 7b formed between the gas introduction walls 2a, 2b and the inner face 6 of the outer peripheral wall 5 are in the closed state at the upstream ends and the peripheral ends thereof and in the open state only at the downstream ends. In FIG. 5 and FIG. 6, the same reference numerals are assigned to the same elements as in FIG. 2 and FIG. 3, and therefore, the description of the elements are omitted.

The exhaust pressure controller 30 in accordance with the present embodiment can be freely changed in design. For example, in FIG. 2, the upstream end 13 of the gas introduction wall 2 may be bent radially outwardly to form an outwardly bent portion so that the outwardly bent portion is fixed to the inner wall 6 of the outer peripheral wall 5 directly by welding. Optionally, the length of the gas introduction wall 2 may be extended or shortened according to the positions of the ports 3.

Alternatively, the gas introduction wall 2 may be in the form of a polygonal cylinder, or a substantial cone, such as a truncated cone, a truncated pyramid, or the like.

The number of the gas introduction walls 2 in the modified example shown in FIG. 5 and FIG. 6 may be one or three or larger according to the number and the positions of the ports 3 and may be reduced or increased in peripheral dimension (the width of the arc portions 16) and/or length.

Further, the short pipe body 1 may be designed appropriately to be in, for example, an L-shape by using an L-shaped pipe.

Figure 7:
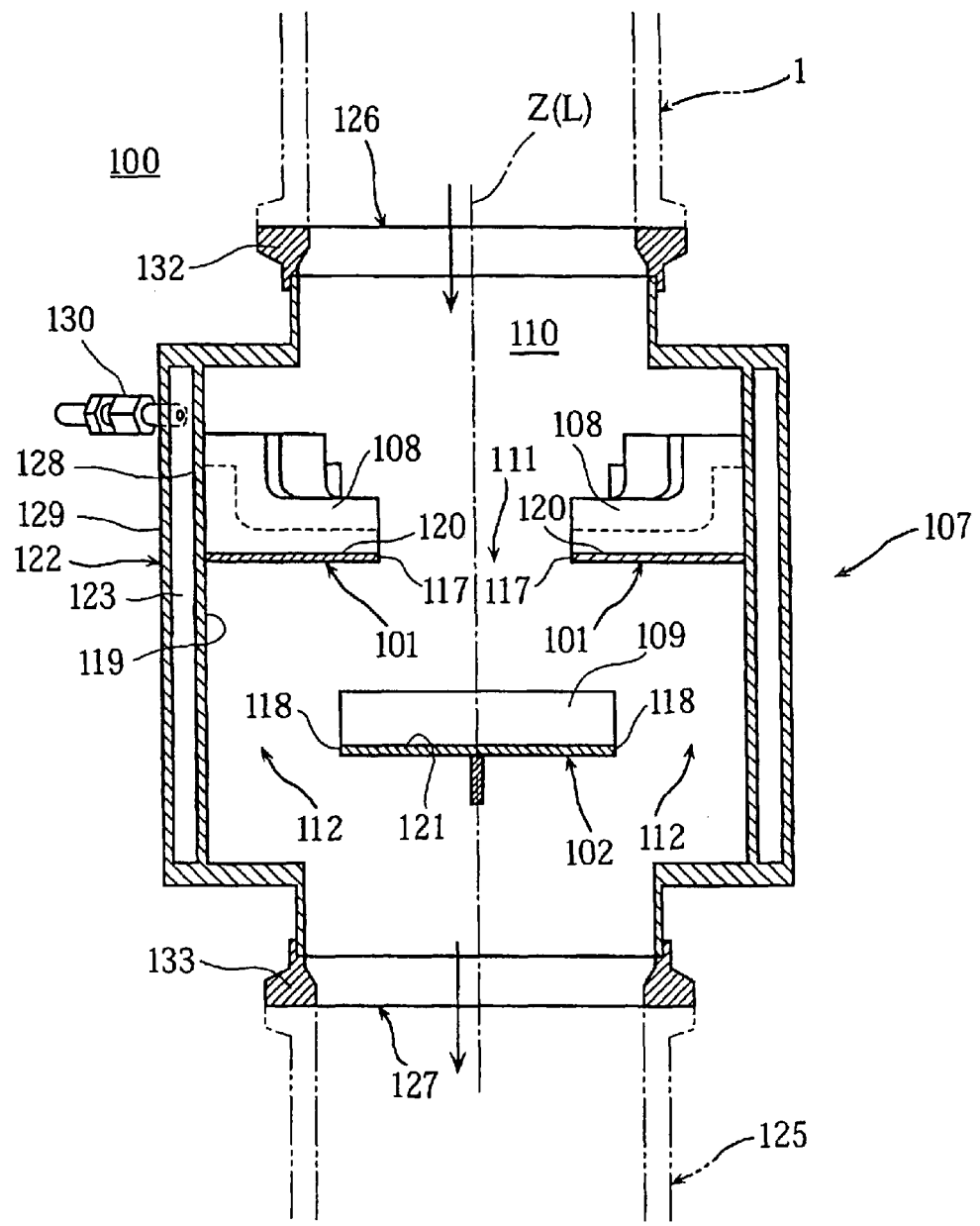
FIG. 7 is a front view in section showing a construction of an exhaust trap included in the exhaust system.
Figure 8:
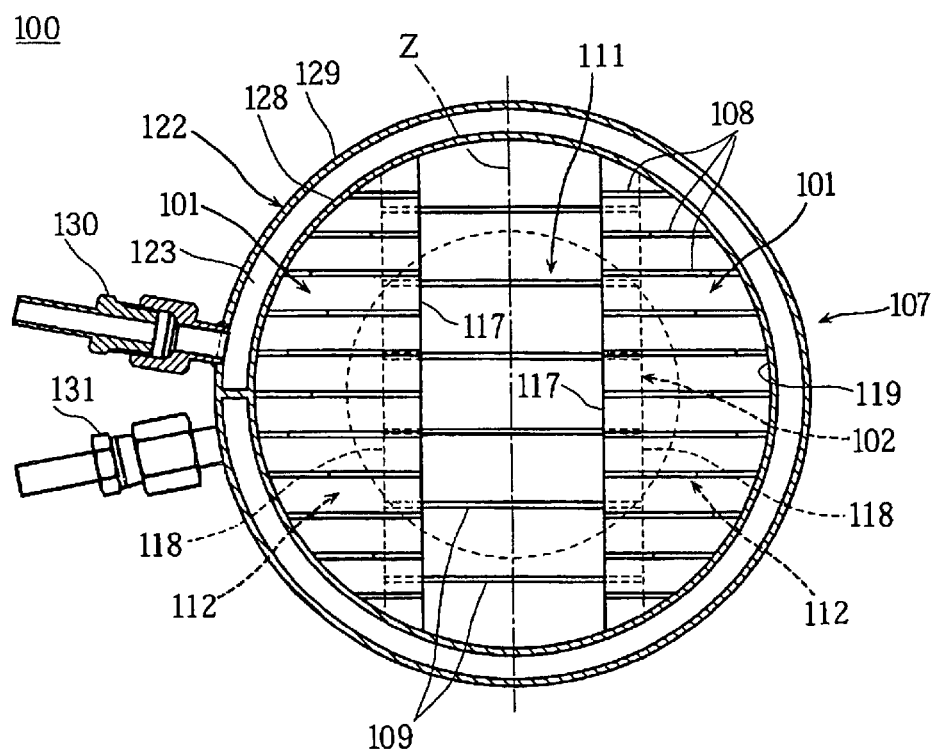
FIG. 8 is a plan view in section of the exhaust trap.
Figure 9:
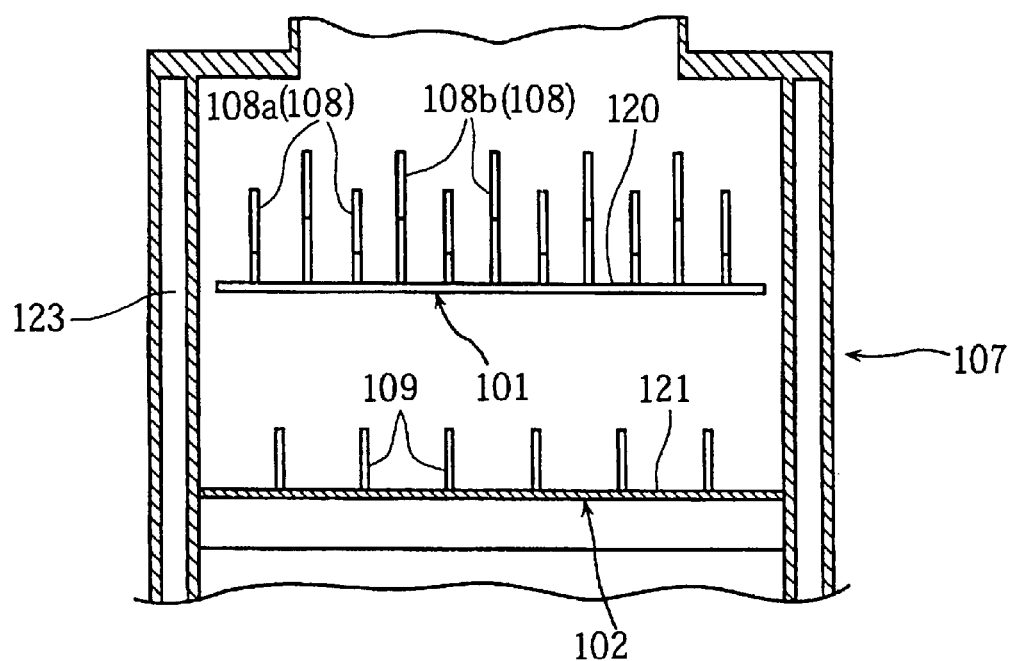
FIG. 9 is a side view in section of the exhaust trap.
Figure 10:
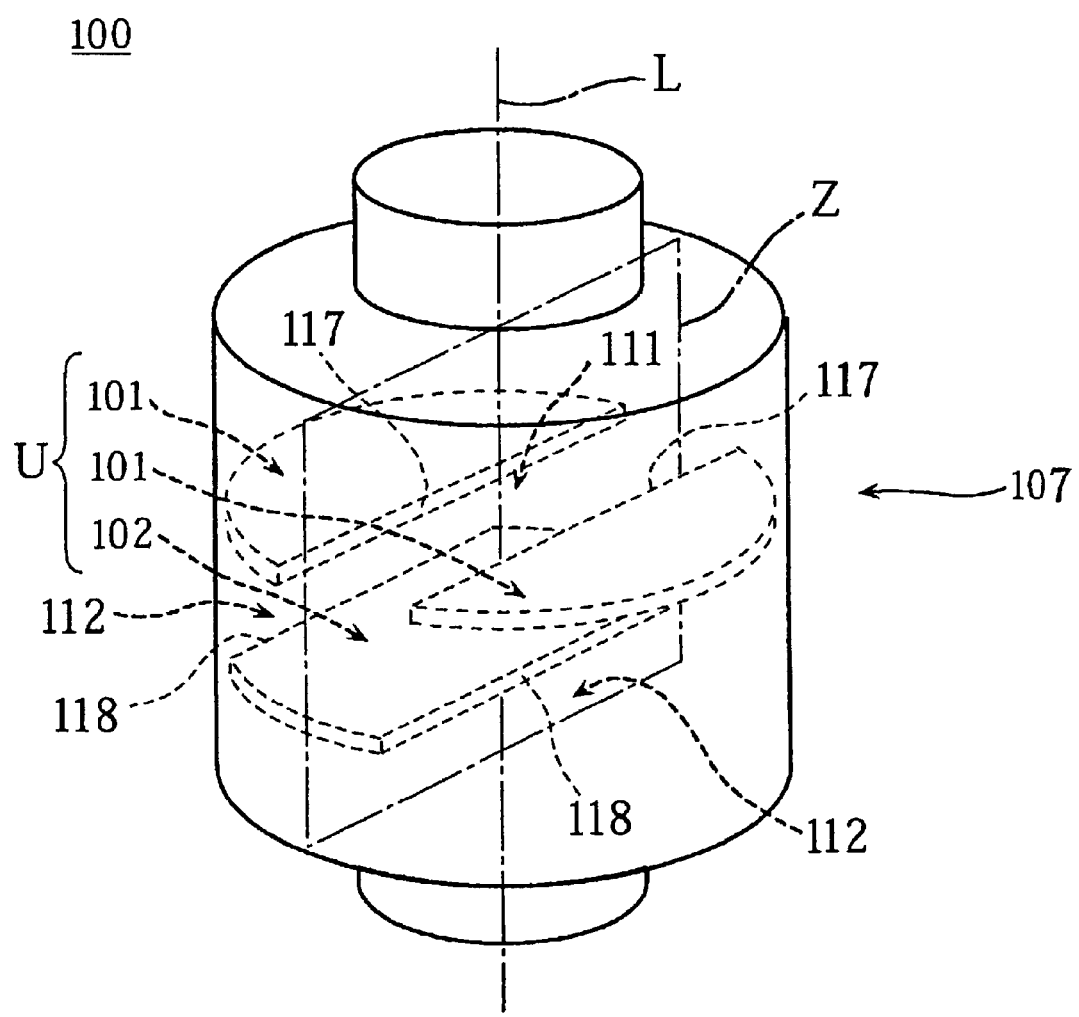
FIG. 10 is a schematic perspective view for explaining the exhaust trap.

The exhaust trap 100 will be described next. FIG. 7 to FIG. 10 shows a construction of the exhaust trap 100 in the present embodiment, wherein FIG. 7 is a front view in section, FIG. 8 is a plan view in section, FIG. 9 is a side view in section, and FIG. 10 is a schematic perspective view for explanation.

As shown in FIG. 7, the exhaust trap 100 in the present embodiment includes the coagulation pipe 107 including an exhaust gas path 110. In the coagulation pipe 107, a pair of semi-circular first adhesion plates 101, 101 are arranged symmetrically with respect to a vertical section Z including the axial center L of the coagulation pipe 107 (see FIG. 10). The respective first adhesion plates 101, 101 have straight inner edges 117, 117, between which a first flow path 111 is formed.

A bond-shaped second adhesion plate 102 is provided downstream of the first flow path 111 in the coagulation pipe 107. The second adhesion plate 102 is provided so as to correspond to (be overlapped with) the first flow path 111 as viewed in the direction of the axial center L and so as to bringe radially the inner face 119 of the coagulation pipe 107. A pair of second path 112, 112 are formed between the respective edges 118, 118 in the width direction (the transverse direction in FIG. 8) of the second adhesion plate 102 and the inner wall 119 of the coagulation pipe 107 so as to be symmetric with respect to the vertical section Z (see FIG. 10). The width of the second adhesion plates 102 is set larger than that of the first flow path 111.

Moreover, as shown in FIG. 7, multiple (11 in the drawings, for example) fins 108 in substantially L-shapes (elbow shapes) stand on the upper face 120 of each first adhesion plate 101 while multiple (six in the drawing, for example) fins 109 in a rectangular shape (band shape) stand on the upper face 121 of the second adhesion plate 102.

The fins 108 on the first adhesion plates 101 include, as shown in FIG. 9, two types of fins 108a, 109b different in height (the vertical direction in FIG. 9) from each other. The short fins 108a and the long fins 108b are arranged alternately at a regular pitch. In contrast, the fins 109 on the second adhesion plate 102 are equal to each other in height and are arranged at a pitch wider than that of the fins 108a, 108b on the first adhesion plates 101. The fins 108a, 108b on the first adhesion plates 101 and the fins 109 on the second adhesion plate 102 are arranged in parallel with each other and are intersected at a right angle with the vertical section Z. Preferably, each surface of the fins 108a, 108b on the first adhesion plates 101 are subjected to blasting (for example, glass bead blasting).

As shown in FIG. 7 and FIG. 8, the coagulation pipe 107 includes a cylindrical cooling space 123 for introducing inside an outer peripheral wall 122 a cooling medium, such as cold water. In other words, the outer peripheral wall 122 includes the inner wall 128 and an outer wall 129, between which the cylindrical cooling space 123 is formed. A water supply tube adopter 130 for mounting a water supply tube and a water discharge tube adopter 131 for mounting a water discharge tube are provided at the outer wall 129 so as to protrude radially outwardly.

The coagulation pipe 107 is detachably fitted at an upstream end 126 and a downstream end 127 thereof to an upstream exhaust pipe (the short pipe body 1 of the exhaust pressure controller 30 in the indicated example) and a downstream exhaust pipe 125, respectively. As shown in FIG. 7, the coagulation pipe 107 includes at the upstream end 126 and the downstream end 127 thereof flanges 132, 133, respectively. The flanges 132, 133 are joined to the flanges (end portions) of the short pipe body 1 and the exhaust pipe 125, respectively, by fastening victoric joints (not shown) or the like. In order to secure the exhaust gas path 110 in the coagulation pipe 107 sufficiently, the inner face 119 of the coagulation pipe 107 is set lager in diameter than the inner diameters of the short pipe body 1 of the exhaust pressure controller 30 and the downstream exhaust pipe 25.

An operation of the above described exhaust trap 100 will be described next. In association with the operation of the processing equipment for the semiconductor wafers 40, the exhaust gas including the unreacted gas is discharged from the reaction chamber 41 and is sent into the coagulation pipe 107. While, cold water is supplied to the cylindrical cooling space 123 of the coagulation pipe 107 for cooling the adhesion plates 101, 102 and the standing fins 108, 109 in the coagulation pipe 107. The exhaust gas flowing in the coagulation pipe 107 from the upstream short pipe body 1 first comes into contact with the upper faces 120 of the first adhesion plates 101 or the fins 108 on the upper faces 120 thereof to lower the temperature thereof. As a result, part of the unreacted gas in the exhaust gas coagulates and is precipitated to form a deposition of a solid material generated therefrom on (adhere to) the fins 108 and the upper faces 120 of the first adhesion plates 101.

Subsequently, the exhaust gas passes through the first path 111 between the first adhesion plates 101, 101 to come into contact with the upper face 121 of the downstream second adhesion plate 102 or the fins on the upper face 121 thereof.

The exhaust gas in contact with the second adhesion plates 102 or the fins 109 is further cooled so that the solid material is precipitated from the unreacted gas remaining in the exhaust gas and is deposited on (adheres to) the fins 102 or the upper face 121 of the second adhesion plate 102. Thereafter, the exhaust gas flows through the second paths 112 to the downstream exhaust pipe 125.

In this way, the unreacted gas in the exhaust gas coagulates to be the solid material in the coagulation pipe 107, and then, is recovered. When maintenance (cleaning) is necessitated because the solid material adheres to fins 108, 109 and the adhesion plates 101, 102 of the coagulation pipe 107, the coagulation pipe 107 is taken out from the short pipe body 1 of the exhaust pressure controller 30 and the exhaust pipe 125 and is then subjected to ultrasonic cleaning.

Figure 11:
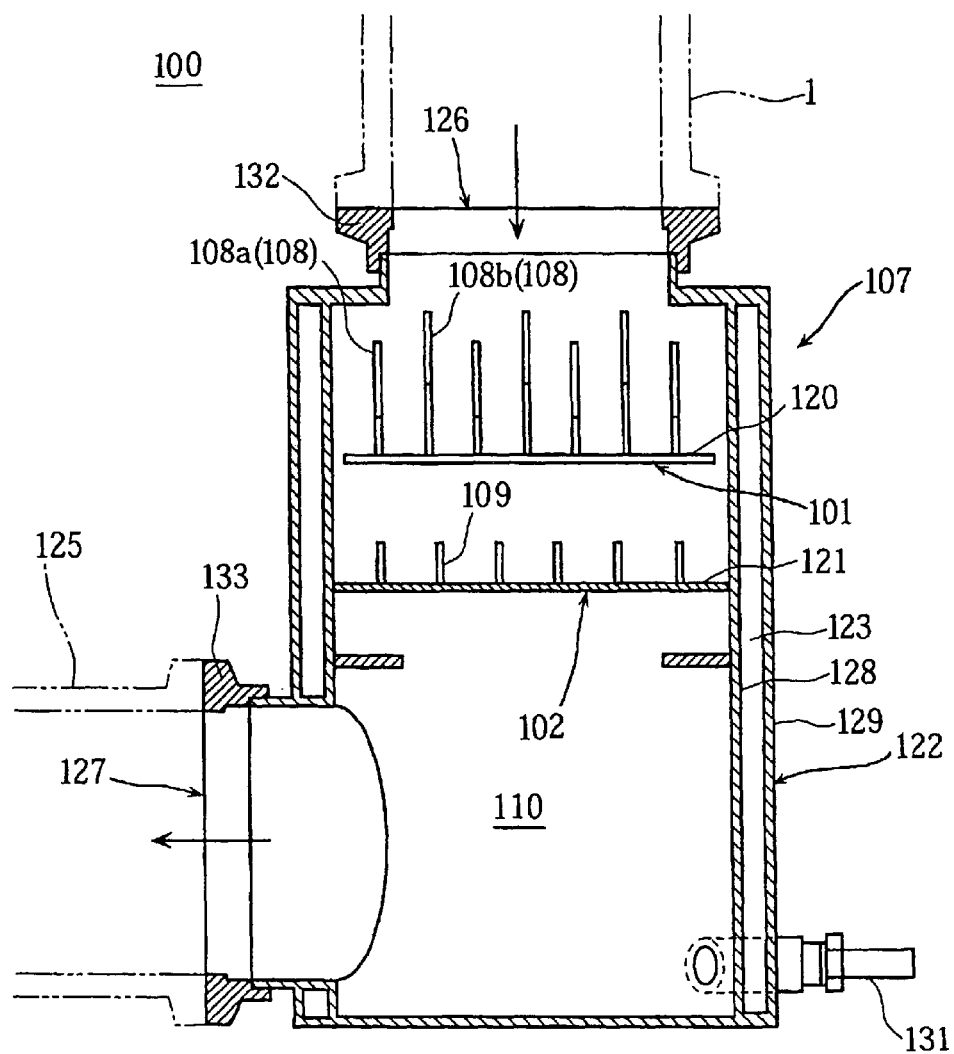
FIG. 11 is a front view in section showing Modified Example 1 of the exhaust trap.
Figure 12:
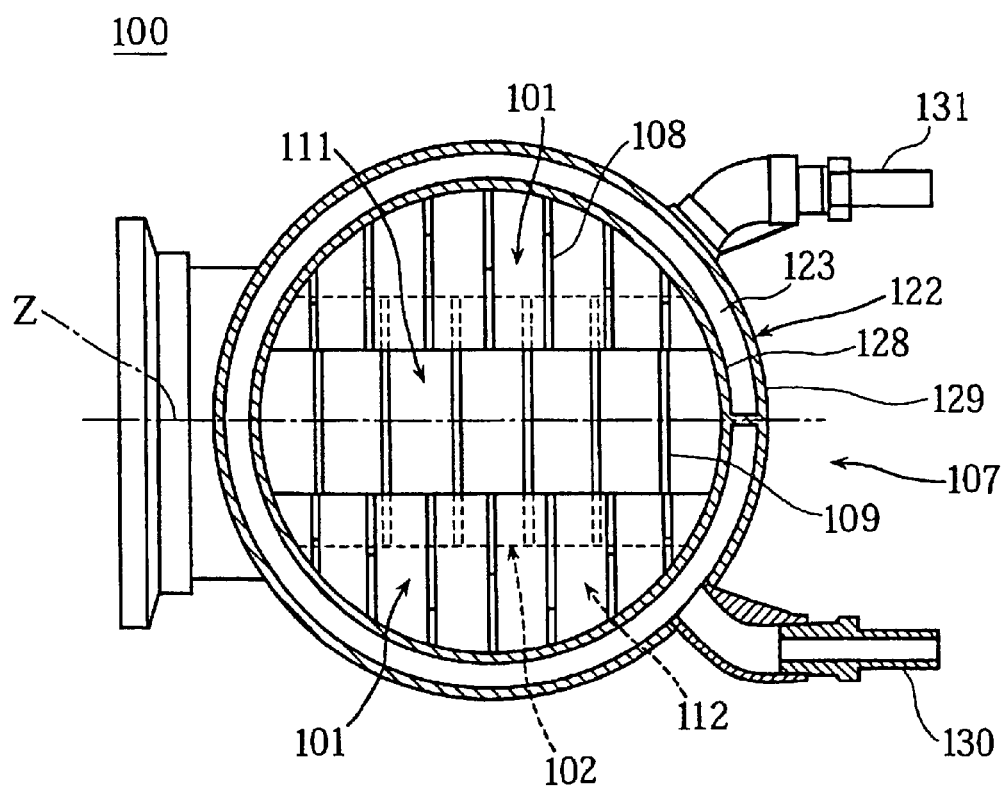
FIG. 12 is a plan view in section of Modified Example 1.
Figure 13:
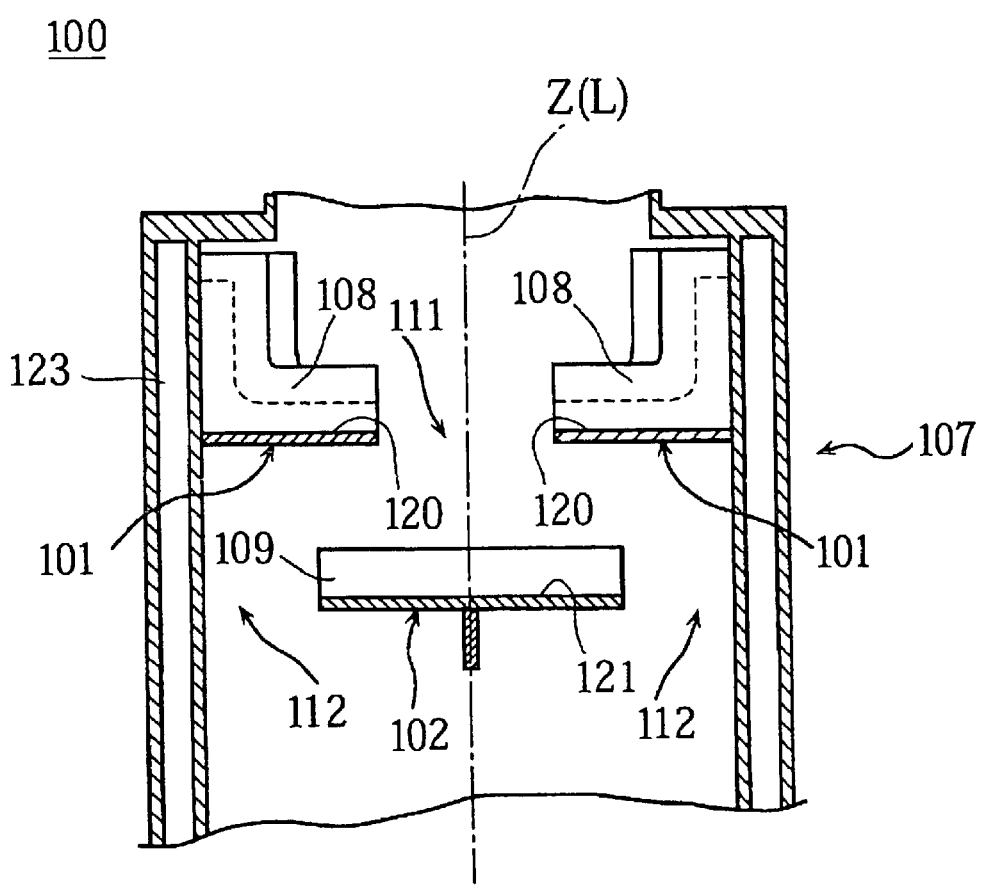
FIG. 13 is a side view in section of Modified Example 1.

FIG. 11 to FIG. 13 shows Modified Example 1 of the exhaust trap 100, wherein FIG. 11 is a front view in section, FIG. 2 is a plan view in section, and FIG. 13 is a side view in section. The same reference numerals are assigned to the same elements as those in FIG. 7 to FIG. 9. While the above described exhaust trap 100 forms the straight exhaust gas path 110, the exhaust trap 100 in Modified Example 1 forms an L-shaped exhaust gas path 110 in contrast.

Similarly to the above described exhaust trap 100, the exhaust trap 100 in Modified Example 1 includes, from the upstream side in the coagulation pipe 107, a pair of substantially semi-circular first adhesion plates 101, 101 and a band-shaped second adhesion plate 102 in this order (see FIG. 13). The multiple fins 108, 109 stand on the upper faces 120 of the first adhesion plates 101 and the upper face 121 of the second adhesion plate 102, respectively. The first adhesion plates 101, 101 and the second adhesion plate 102 are arranged upstream of (upper than) a downstream open end 127 of the coagulation pipe 107 so that the exhaust gas flowing in the coagulation pipe 107 surely comes into contact with the first adhesion plates 101, 101 and the second adhesion plate 102 before flowing to the downstream part. The fins 108 on the first adhesion plates 101, 101 are in L-shapes (elbow shapes) (see FIG. 13) similarly to the case shown in FIG. 7 to FIG. 9, and the fins 108a, 108b different from each other in height are arranged alternately (see FIG. 11). The other part of the exhaust trap 100 is the same as that shown in FIG. 7 to FIG. 9, and therefore, the description thereof is omitted.

FIG. 14 and FIG. 15 are schematic perspective views showing Modified Example 2 and Modified Example 3 of the exhaust trap 100, respectively.

In Modified Example 2 (FIG. 14), the coagulation pipe 107 includes, from the upstream side, the pair of first adhesion plates 101, 101, the second adhesion plate 102, a pair of third adhesion plates 103, 103, and a fourth adhesion plate 104. The third adhesion plates 103 are the same or substantially same in form and dimension as the first adhesion plates 101. The fourth adhesion plate 104 is the same or substantially the same in form and dimension as the second adhesion plate 102. Further, the third adhesion plates 103, 103 are arranged so as to be overlapped with the respective long side ends of the second adhesion plate 102 as viewed in the direction of the axial center L of the coagulation pipe 107. The fourth adhesion plate 104 is arranged so as to extend in the direction crossing over the longitudinal direction of the second adhesion plate 102. In other words, when one set of adhesion plate unit U is supposed to be composed of the pair of first adhesion plates 101, 101 and second adhesion plate 102, as shown in FIG. 10, the exhaust trap 100 of Modified Example 2 includes two sets of the adhesion plate unit U arranged in such a fashion that one unit U is arranged successively to the other unit U along the axial center L in the coagulation pipe 107 with the angle of the one unit U shifted (rotated) by 90° around the axial center L.

Referring to Modified Example 3 (FIG. 15), the exhaust trap 100 further includes, under the fourth adhesion plate in this order, a pair of fifth adhesion plates 105, 105, which are the same or substantially same in form and dimension as the first adhesion plates 101, 101, and a sixth adhesion plate 106, which is the same or substantially the same in form and dimension as the second adhesion plate 102. In other words, three sets of the adhesion plate units U each composed of the pair of first adhesion plates 101, 101 and the second adhesion plate 102 are arranged in such a fashion that the units U are arranged successively along the axial center L with the angle of the units U shifted (rotated) by 90° around the axial center L. The fins on each adhesion plate 101 to 106 and the outer peripheral wall of the coagulation pipe 107 in the dual structure are the same as those shown in FIG. 10, and, therefore, not shown.

The exhaust trap 100 in the present embodiment is changeable in design, as well. For example, four or more sets of the adhesion plate unit U shown in FIG. 10 may be arranged in the coagulation pipe 107 with the angle of the units U shifted (rotated) by arbitrary degrees in the peripheral direction of the coagulation pipe 107.

A window (a viewing port) may be provided in the outer peripheral wall 122 of the coagulation pipe 107 so that the inside state of the coagulation pipe 107 where the solid material adheres can be checked from the outside. This facilitates determination of the timing for maintenance (cleaning).

In order to facilitate the maintenance (cleaning), each adhesion plate 101, 102, . . . may be provided detachably to the inner face 199 of the coagulation pipe 107.

The coagulation pipe 107 of the exhaust trap 100 in the present embodiment may be in the form of which axial center L extends horizontally or perpendicularly or is inclined at arbitrary degrees.

Figure 17:
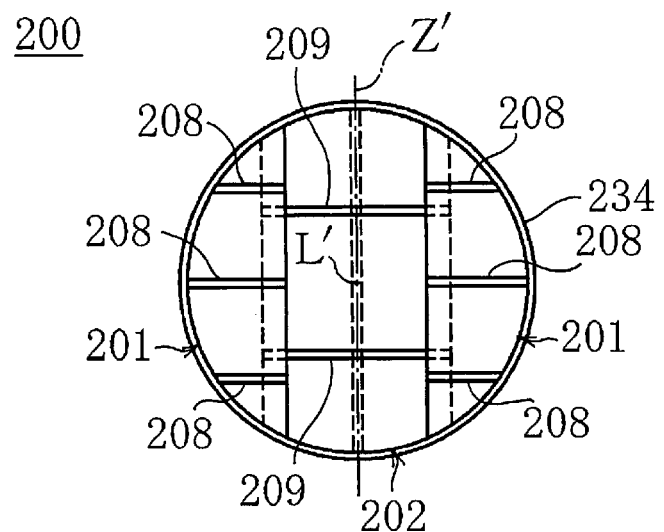
FIG. 17 is a plan view of the center ring.
Figure 16:
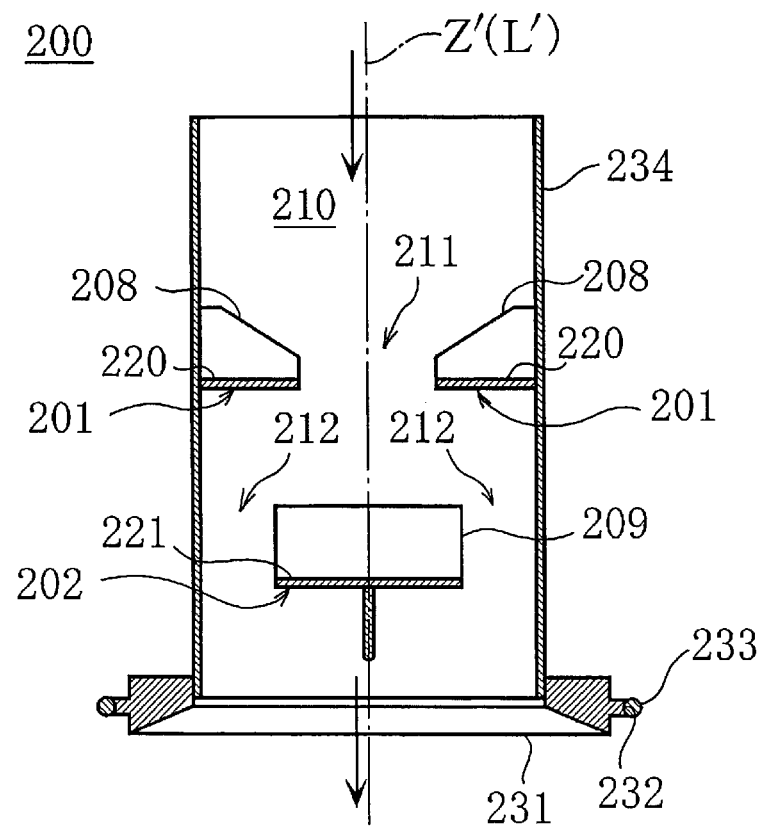
FIG. 16 is a vertical sectional view showing a construction of a center ring included in the exhaust system.
Figure 18:
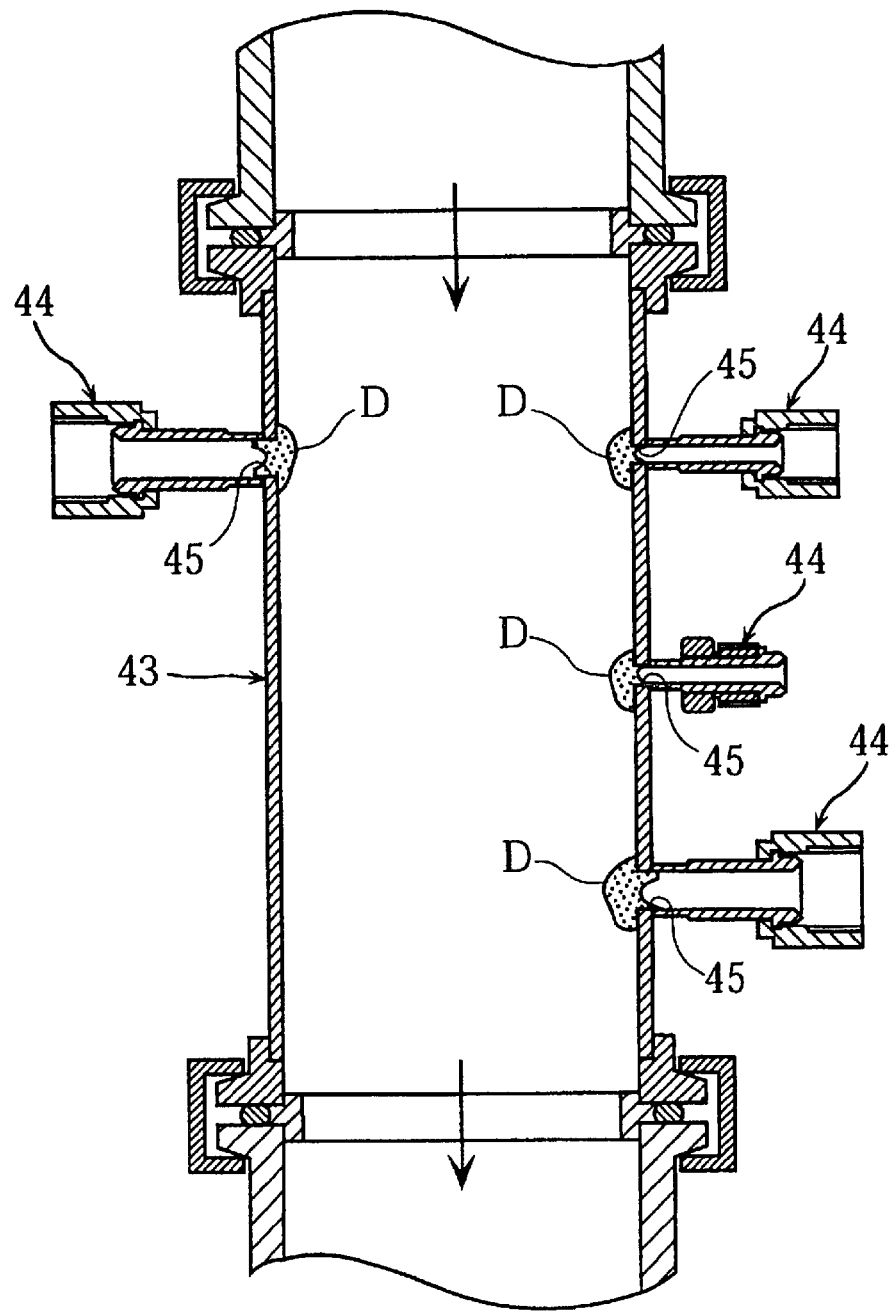
FIG. 18 is a vertical sectional view of an exhaust pressure controller in a conventional exhaust system.

FIG. 16 and FIG. 17 shows a center ring 200 of the exhaust system in accordance with the present embodiment, wherein FIG. 16 is a vertical sectional view and FIG. 17 is a plan view.

The center ring 200 includes a ring 231. A trench 232 is formed in the outer peripheral part of the ring 231, and an O-ring 233 as a sealing member is fitted in the trench 232. A sleeve 234 in the form of a circle in section is provided integrally with the ring 231. The sleeve 234 is arranged inside at least one (the exhaust pipe 250 in the indicated example) of the exhaust pipe 250 located upstream of the ring 231 and an upstream joint part 47a of the exhaust gas detoxifier 47 located downstream thereof. The sleeve 234 forms an exhaust gas path 210.

Inside the sleeve 234, a pair of adhesion plates 201, 201 are provided so as to be opposed to each other with a vertical section Z' including the axial center L' of the sleeve 234 interposed. A first path 211 is formed between the inner edges 217, 217 of the first adhesion plates 201, 201. On the downstream side of the first path 211 in the sleeve 234, a second adhesion plate 202 is provided so as to correspond to the first path 211 as viewed in the direction of the axial center L' and so as to bridge the inner face of the sleeve 234. A pair of second paths 212 opposed to each other with the vertical section Z' interpose are formed between the edges 218, 218 in the widthwise direction of the second adhesion plate 202 and the inner face of the sleeve 234. From an upper face 220 of each first adhesion plate 201, a plurality (three in the indicated example) of fins 208 protrude toward the upstream side. As well, a plurality (two in the indicated example) of fins 209 protrude toward the upstream side from an upper face 221 of the second adhesion plate 202.

The specific aspect of the center ring 200 may be set appropriately according to needs. For example, if the upstream joint part 47a of the exhaust gas detoxifier 47 (in general, a joint part on the downstream side of the ring 231) can accommodate the sleeve 234, the sleeve 234 may be arranged at the downstream side in contrast to the aforementioned case or may be arranged at each of the upstream side and the downstream side.

The form and the number of the adhesion plates 201, 202 inside the sleeve 234 may be changed freely, similarly to the exhaust trap 100.

As described above, the exhaust pressure controller 30 of the exhaust system in accordance with the present embodiment is detachably interposed in the middle of the exhaust passage and includes the short pipe body 1. In the short pipe body 1, the ports 3 are formed in the outer peripheral wall 5 for air supply/discharge and/or inert gas introduction. The gas introduction wall 2 forms inside the other face 22 thereof the exhaust gas path 4, along which the exhaust gas to flows, so that the exhaust gas flowing from the upstream side of the short pipe body 1 flows downstream without coming into direct contact with the ports 3 and the vicinity thereof. The gas introduction wall 2 also forms the pressure control path 7 between the one face 21 thereof and the inner face 6 of the outer peripheral wall 5 so that the ports 3 is allowed to communicate with the pressure control path 7 for allowing the pressure control path 7 to communicate with the exhaust gas path 4 at the downstream side of the ports 3. Hence, the solid material generated from the unreacted gas in the exhaust gas is prevented from adhering to and depositing on the ports 3 and the vicinity thereof to prevent clogging of the ports 3. As a result, the cycle of the maintenance (cleaning) of the exhaust pressure controller 30 can be extended, thereby contributing to an increase in availability of the processing equipment for the semiconductor wafers 40.

The exhaust pressure controller 30 can be detached from the exhaust passage, so that the inside of the short pipe body 1 can be cleaned readily.

Further, the upstream end 13 of the gas introduction wall 2 is fixed to the ring 9 detachably fitted to the upstream inner edge of the short pipe body 1, so that the gas introduction wall 2 can be taken out easily together with the ring 9 from the short pipe body 1, facilitating the cleaning operation of the gas introduction wall 2 and the inside of the short pipe body 1.

Moreover, the gas introduction wall 2 and the elastic sealing member 8 are integrally formed with the ring 9, so that the gas introduction wall 2, the ring 9, and the elastic sealing member 7 can be mounted easily and speedily after maintenance.

Furthermore, the gas introduction wall 2 is formed along the inner face 6 of the outer peripheral wall 5, which is a simple construction and ensures prevention of the exhaust gas from coming into contact with the ports 3 and the vicinity thereof.

In the exhaust trap 100 of the exhaust system in accordance with the present embodiment, which causes the unreacted gas included in the exhaust gas to coagulate and recovers it: the pair of first adhesion plates 101, 101 are arranged in the coagulation pipe 107 forming the exhaust gas path 110 symmetrically with respect to the vertical section Z including the axial center L of the coagulation pipe 107 so that the first path 111 is formed between the first adhesion plates 101, 101; the band-shaped second adhesion plate 102 is arranged downstream of the first path 111 so as to correspond to the first path 111 as viewed in the direction of the axial center L and so as to bridge radially the inner face 119 of the coagulation pipe 107 so that the pair of second paths 112, 112 are formed between the second adhesion plate 102 and the inner wall 119 of the coagulation pipe 107 symmetrically with respect to the vertical section Z; and the multiple fins 108, 109 stands on the upper faces 120 of the first adhesion plates 101 and the upper face 121 of the second adhesion plate 102, respectively. Hence, the unreacted gas included in the exhaust gas is caused to coagulate so that the solid material (deposition) generated therefrom is recovered efficiently.

In other words, the unreacted gas in the exhaust gas discharged from the reaction chamber 41 is caused to coagulate in the exhaust trap 100 to be the solid material, thereby being recovered. This suppresses adhesion of the solid material to the inside of the exhaust pipe 11, the vacuum exhauster 42, and the like. In contrast to the conventional one as disclosed in Japanese Patent Application Laid Open Publication Nos. 2000-114185, 9-72291, 2000-70664, or the like, the solid material is prevented from flying back (backflow) to the reaction chamber 41 to thus prevent adhesion thereof to the semiconductor wafers 40, thereby increasing the yield. As well, adhesion of the solid material is prevented to obviate clogging and disorder of the vacuum exhauster 42.

Specifically, the multiple fins 108, 109 stand on the upper faces 120 of the first adhesion plates 101 and the upper face 121 of the second adhesion plate 102, respectively, so that a large amount of the unreacted gas is caused to be the solid material and adhere to the fins 108, 108. The fins 108, 109 provided on the upper faces 120, 121 receive less influence of backflow of the exhaust gas, which is caused due to pressure variation of the exhaust gas in the exhaust passage, so that the solid material adhering to the fins 108, 109 is prevented from falling therefrom.

In contrast to the conventional one, a large amount of the solid material is caused to adhere to the multiple fins 108, 109 provided in the small space, thereby leading to compaction of the exhaust trap 100 as a whole. Since the path does not meander and is simple in structure, the exhaust gas flows smoothly (with a sufficient amount of exhaust volume secured) to reduce the pressure variation itself and to facilitate maintenance (cleaning).

Further, to the exhaust trap 100 of the present embodiment, the solid material generated from the unreacted gas in the exhaust gas is much liable to adhere. Accordingly, the aforementioned effects can be sufficiently exhibited when the exhaust system of the present invention is applied for processing equipment for forming a silicon nitride film on the surface of a semiconductor substrate and the like besides application for the vertical hot wall type low pressure CVD (LP-CVD).

The fins 108a, 108b different in height from each other are arranged alternately on the upper faces 120 of the adhesion plates 101 to generate turbulent flow of the exhaust gas, so that the solid material is more liable to adhere to the fins 108a, 108b.

Further, the cylindrical cooling space 123 to which the cooling medium is introduced is provided inside the outer peripheral wall 122 of the coagulation pipe 107 to cool the adhesion plates 101, 102 and the fins 108, 109 in the coagulation pipe 107, thereby causing a large amount of the solid material to adhere thereto. Specifically, when the exhaust gas is in contact with the cooled adhesion plates 101, 102 or the cooled fins 108, 109, the temperature of the exhaust gas lowers quickly to promote coagulation of the unreacted gas in the exhaust gas, thereby causing a large amount of the solid material to adhere to the adhesion plates 101, 102 or the fins 108, 109.

The surfaces of the multiple fins 108, 109 are subjected to blasting to be rough, which promotes adhesion of the solid material thereto. In addition, the adhering solid material hardly falls off therefrom.

The coagulation pipe 107 is detachable at the upstream end 126 and the downstream end 127 thereof from the short pipe body 1 of the exhaust pressure controller 30 and the exhaust pipe 125, respectively, so that the entire exhaust trap 100 can be taken out from the exhaust passage for cleaning, facilitating the cleaning operation to increase the maintainability.

In addition, when the third adhesion plates 103, 103, of which form and dimension are the same as the pair of first adhesion plates 101, 101, are arranged downstream of the second adhesion plate 102 so as to be overlapped with the second adhesion plate 102 as viewed in the direction of the axial center L and the fourth adhesion plate 104, of which form and dimension are the same as the second adhesion plate 102, are arranged downstream of the third adhesion plates 103 so as to cross over the second adhesion plate 102 as viewed in the direction of the axial center L, the amount of the solid material that can be recovered in the coagulation pipe 107 increases easily to prevent definitely the solid material from adhering to the inside of the exhaust pipe and the vacuum exhauster 42 downstream of the exhaust trap 100.

The center ring 200 of the exhaust system in accordance with the present embodiment causes coagulation of a particle component remaining in the exhaust gas discharged from the vacuum exhauster 42, obviating degradation and disorder of the exhaust gas detoxifier 47 located downstream of the center ring 200 and remarkably reducing the frequency of maintenance of the exhaust gas detoxifier 47. This contributes to an increase in availability of the exhaust system and an increase in productivity of the semiconductor wafer 40 manufactured in the reaction chamber 41.

Though the above embodiment describes the exhaust system for semiconductor element processing equipment, the present invention is applicable to various kinds of exhaust systems that discharge an exhaust gas including a component that generates a solid material.

The invention claimed is:
1. An exhaust system comprising:
   an exhaust pressure controller interposed in an exhaust passage and including:
      a pipe body including a side peripheral wall in which at least one port is formed; said at least one port having a discrete orifice introducing a gas; and
      a gas introduction wall for introducing an exhaust gas flowing from an upstream side of the pipe body so that the exhaust gas flows downstream without coming into direct contact with the port and vicinity thereof, one face of the gas introduction wall forming a pressure control path together with an inner face of the side peripheral wall while another face of the gas introduction wall forming an exhaust gas path along which the exhaust gas flows, the gas introduction wall being shorter in length than the pipe body, wherein the length is in a longitudinal axis of the pipe body,
      wherein the port communicates with the pressure control path, and the pressure control path communicates with the exhaust gas path at part downstream of the port;

an exhaust trap for causing a reacted gas in the exhaust gas to coagulate and catching coagulated reacted gas,
wherein the exhaust trap includes:
  a coagulation pipe interposed in the exhaust passage;
  a pair of first adhesion plates opposed to each other in the coagulation pipe with a vertical section including an axial center of the coagulation pipe interposed, a first path being formed between the pair of first adhesion plates;
  a band-shaped second adhesion plate formed downstream of the first path in the coagulation pipe so as to correspond to the first path as viewed in a direction of the axial center thereof and so as to bridge an inner face of the coagulation pipe, a pair of second paths being formed between the second adhesion plate and the inner face of the coagulation pipe so as to be opposed to each other with the vertical section interposed; and
  a plurality of fins standing on upper faces of the pair of first adhesion plates and an upper face of the second adhesion plate;
  wherein adjacent fins standing on the upper faces of the first adhesion plates are different in height from each other.

2. The exhaust system of claim 1,
wherein the exhaust pressure controller further includes:
  a ring detachably fitted to an upstream inner edge of the pipe body; and
  an annular sealing member fitted around an outer periphery of the ring so as to be interposed between an upstream end of the pipe body and an exhaust pipe located upstream of the pipe body,
wherein an upstream end of the gas introduction wall is fixed to the ring.

3. The exhaust system of claim 1,
wherein the gas introduction wall is in a cylindrical form along the inner face of the side peripheral wall.

4. The exhaust system of claim 1,
wherein a cylindrical cooling space to which a cooling medium is introduced is formed inside a side peripheral wall of the coagulation pipe.

5. The exhaust system of claim 1,
wherein each of the plurality of fins has a surface subjected to blasting.

6. The exhaust system of claim 1,
wherein the coagulation pipe is detachable at an upstream end and a downstream end thereof from an upstream exhaust pipe and a downstream exhaust pipe, respectively.

7. The exhaust system of claim 1,
wherein the exhaust trap is arranged downstream of the exhaust pressure controller.

8. The exhaust system of claim 1, further comprising:
a vacuum exhauster provided downstream of the exhaust trap.

9. The exhaust system of claim 1, further comprising:
a center ring arranged at a joint part between exhaust pipes adjacent in a direction that the exhaust gas passes,
wherein the center ring includes:
  a ring interposed between the adjacent exhaust pipes;
  an annular sealing member fitted around an outer periphery of the ring;
a sleeve integrally formed with the ring and arranged inside at least one of the adjacent exhaust pipes;
  a pair of first adhesion plates opposed to each other in the sleeve with a vertical section including an axial center of the sleeve interposed, a first path being formed between the pair of first adhesion plates;
  a second adhesion plate formed downstream of the pair of first adhesion plates in the sleeve so as to correspond to the first path as viewed in a direction of the axial center and so as to bridge an inner face of the sleeve, a pair of second paths being formed between the second adhesion plate and the inner face of the sleeve so as to be opposed to each other with the vertical section interposed; and
  a plurality of fins standing on the upper faces of the pair of first adhesion plates and an upper face of the second adhesion plate.

10. The exhaust system of claim 9, further comprising:
an exhaust gas detoxifier arranged downstream of the center ring for eliminating an unreacted gas in the exhaust gas.

11. An exhaust system comprising:
an exhaust pressure controller interposed in an exhaust passage and including:
  a pipe body including a side peripheral wall in which at least one port is formed; said at least one port having a discrete orifice introducing a gas; and
  a gas introduction wall for introducing an exhaust gas flowing from an upstream side of the pipe body so that the exhaust gas flows downstream without coming into direct contact with the port and vicinity thereof, one face of the gas introduction wall forming a pressure control path together with an inner face of the side peripheral wall while another face of the gas introduction wall forming an exhaust gas path along which the exhaust gas flows, the gas introduction wall being shorter in length than the pipe body, wherein the length is in a longitudinal axis of the pipe body,
  wherein the port communicates with the pressure control path, and the pressure control path communicates with the exhaust gas path at part downstream of the port;
an exhaust trap for causing a reacted gas in the exhaust gas to coagulate and catching coagulated reacted gas,
wherein the exhaust trap includes:
  a coagulation pipe interposed in the exhaust passage;
  a pair of first adhesion plates opposed to each other in the coagulation pipe with a vertical section including an axial center of the coagulation pipe interposed, a first path being formed between the pair of first adhesion plates;
  a band-shaped second adhesion plate formed downstream of the first path in the coagulation pipe so as to correspond to the first path as viewed in a direction of the axial center thereof and so as to bridge an inner face of the coagulation pipe, a pair of second paths being formed between the second adhesion plate and the inner face of the coagulation pipe so as to be opposed to each other with the vertical section interposed; and
  a plurality of fins standing on upper faces of the pair of first adhesion plates and an upper face of the second adhesion plate;
wherein the exhaust trap further includes:
  a pair of third adhesion plates which are substantially same in form and dimension as the pair of first adhesion plates and which are arranged downstream of the second adhesion plate in the coagulation pipe so as to be overlapped with the second adhesion plate as viewed in the direction of the axial center; and a fourth adhesion plate which is substantially same in form and dimension as the second adhesion plate and which is arranged downstream of the third adhesion plates in the coagulation pipe so as to cross over the second adhesion plate as viewed in the direction of the axial center.

12. The exhaust system of claim 11,
wherein the exhaust pressure controller further includes:
a ring detachably fitted to an upstream inner edge of the pipe body; and
an annular sealing member fitted around an outer periphery of the ring so as to be interposed between an upstream end of the pipe body and an exhaust pipe located upstream of the pipe body,
wherein an upstream end of the gas introduction wall is fixed to the ring.

13. The exhaust system of claim 11,
wherein the gas introduction wall is in a cylindrical form along the inner face of the side peripheral wall.

14. The exhaust system of claim 11,
wherein a cylindrical cooling space to which a cooling medium is introduced is formed inside a side peripheral wall of the coagulation pipe.

15. The exhaust system of claim 11,
wherein each of the plurality of fins has a surface subjected to blasting.

16. The exhaust system of claim 11,
wherein the coagulation pipe is detachable at an upstream end and a downstream end thereof from an upstream exhaust pipe and a downstream exhaust pipe, respectively.

17. The exhaust system of claim 11,
wherein the exhaust trap is arranged downstream of the exhaust pressure controller.

18. The exhaust system of claim 11, further comprising:
a vacuum exhauster provided downstream of the exhaust trap.

19. The exhaust system of claim 11, further comprising:
a center ring arranged at a joint part between exhaust pipes adjacent in a direction that the exhaust gas passes,
wherein the center ring includes:
a ring interposed between the adjacent exhaust pipes;
an annular sealing member fitted around an outer periphery of the ring;
a sleeve integrally formed with the ring and arranged inside at least one of the adjacent exhaust pipes;
a pair of first adhesion plates opposed to each other in the sleeve with a vertical section including an axial center of the sleeve interposed, a first path being formed between the pair of first adhesion plates;
a second adhesion plate formed downstream of the pair of first adhesion plates in the sleeve so as to correspond to the first path as viewed in a direction of the axial center and so as to bridge an inner face of the sleeve, a pair of second paths being formed between the second adhesion plate and the inner face of the sleeve so as to be opposed to each other with the vertical section interposed; and
a plurality of fins standing on the upper faces of the pair of first adhesion plates and an upper face of the second adhesion plate.

20. The exhaust system of claim 19, further comprising:
an exhaust gas detoxifier arranged downstream of the center ring for eliminating an unreacted gas in the exhaust gas.

* * * * *